(12) United States Patent
Santos

(10) Patent No.: US 8,829,945 B2
(45) Date of Patent: Sep. 9, 2014

(54) CIRCUIT AND METHOD FOR DYNAMIC BIASING OF AN OUTPUT STAGE

(75) Inventor: Paulo Santos, Santa Clara, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/176,551

(22) Filed: Jul. 5, 2011

(65) Prior Publication Data

US 2013/0009689 A1 Jan. 10, 2013

(51) Int. Cl.
 *H03B 1/00* (2006.01)
 *H03F 3/217* (2006.01)

(52) U.S. Cl.
 CPC .................................. *H03F 3/217* (2013.01)
 USPC ............ 327/108; 327/263; 327/392; 327/398

(58) Field of Classification Search
 USPC ......... 327/108, 110, 263, 306, 392, 398, 538; 307/31, 36
 See application file for complete search history.

(56) References Cited

U.S. PATENT DOCUMENTS

| | | | |
|---|---|---|---|
| 4,593,206 A | | 6/1986 | Neidorff et al. |
| 5,134,311 A | * | 7/1992 | Biber et al. .................. 327/108 |
| 5,140,279 A | | 8/1992 | Scott, III |
| 5,479,337 A | | 12/1995 | Voigt |
| 5,589,744 A | | 12/1996 | Brambilla |
| 5,767,740 A | | 6/1998 | Fogg |
| 5,923,133 A | | 7/1999 | Menegoli |
| 6,072,289 A | | 6/2000 | Li |
| 6,084,378 A | | 7/2000 | Carobolante |
| 6,130,563 A | * | 10/2000 | Pilling et al. .................. 327/111 |
| 6,185,118 B1 | | 2/2001 | Sander et al. |
| 6,356,141 B1 | * | 3/2002 | Yamauchi ...................... 327/543 |
| 7,426,645 B2 | | 9/2008 | Leung et al. |
| 7,437,137 B2 | * | 10/2008 | Fiedler .......................... 455/317 |
| 7,449,939 B2 | * | 11/2008 | Lin ............................... 327/538 |
| 2007/0024331 A1 | * | 2/2007 | Lin ............................... 327/141 |
| 2008/0042739 A1 | * | 2/2008 | Lin ............................... 327/540 |

OTHER PUBLICATIONS

Sekedi B. Kobenge and Huazhong Yang; Digitally Controllable Delay Element Using Switched-Current Mirror; pp. 1-10; WSEAS Transactions on Circuits and Systems; Issue 7, vol. 8, Jul. 2009; NICS, Department of Electronic Engineering, Tsinghua University, Beijing, China.

Silicon Laboratories Inc.; Motor Control Software Examples; pp. 1-54; AN191, Rev. 1.0 4/04; 2004; Silicon Laboratories Inc., Austin, Texas.

Don Alfano; A Versatile Monolithic Digital PWM Controller; pp. 1-5; Silicon Laboratories Inc., Austin, Texas.

* cited by examiner

*Primary Examiner* — Lincoln Donovan
*Assistant Examiner* — Jung H Kim
(74) *Attorney, Agent, or Firm* — Cesari & Reed LLP; R. Michael Reed

(57) ABSTRACT

A circuit includes a delay circuit, a transition detector, a pre-driver circuit, and a controller. The delay circuit includes an input for receiving a signal and an output for providing a delayed version of the signal. The transition detector is coupled to the input of the delay circuit to detect a transition within the signal and to provide a look ahead signal to a detector output. The pre-driver circuit includes an input coupled to the output of the delay circuit, a control input, at least one signal output, and a plurality of a bias outputs. The controller is coupled to the detector output and to the control input of the pre-driver circuit and is configured to control bias signals on a plurality of bias outputs to selectively increase a driving strength of signals and biases applied to an output stage in response to the look ahead signal.

13 Claims, 6 Drawing Sheets

US 8,829,945 B2

CIRCUIT AND METHOD FOR DYNAMIC BIASING OF AN OUTPUT STAGE

FIELD

The present disclosure is generally related to amplifier circuits, and more particularly to circuits having analog pre-driver circuits for driving an output stage.

BACKGROUND

Pulse width modulation (PWM) systems can be used to generate analog signals from digital data. In some instances, PWM signals are used to drive H-Bridge circuits or other output amplifiers to achieve high power and high efficiency amplification. One particular PWM modulation technique is sometimes referred to as a BD modulation technique. In BD modulation, the content is modulated into a B-PWM signal and a D-PWM signal, and the content is recovered by subtracting the B and D signals.

If the PWM driver circuit provides the BD PWM signal as a pure digital signal with very fast edges, the BD PWM signal has very short propagation times and good distortion performance. Such a signal also provides relatively low "shoot through current". Further, a pure digital PWM driver circuit has relatively low power consumption. Unfortunately, the fast transitions generate strong electromagnetic interference (EMI). While it is possible to improve the EMI performance by using slow slew-rate-controlled edges without penalizing the total harmonic distortion, the slew-rate controlled edges include an additional challenge of controlling the "shoot through current" and requires the use of an analog pre-driver circuit, both of which increase the overall power consumption of the circuit.

SUMMARY

In an embodiment, a circuit includes a delay circuit, a transition detector, a pre-driver circuit, and a controller. The delay circuit includes an input for receiving a signal and an output for providing a delayed version of the signal. The transition detector is coupled to the input of the delay circuit to detect a transition within the signal and to provide a look ahead signal to a detector output. The pre-driver circuit includes an input coupled to the output of the delay circuit, a control input, at least one signal output, and a plurality of a bias outputs. The controller is coupled to the detector output and to the control input of the pre-driver circuit and is configured to control bias signals on the plurality of bias outputs to selectively increase a driving strength of signals and biases applied to an output stage in response to the look ahead signal.

In another embodiment, a processor readable medium embodies instructions that, when executed by a processor, cause the processor to control a pre-driver circuit to dynamically bias an output stage of an integrated circuit. The instructions include first instructions first instructions to receive a look ahead signal indicating a transition within an input signal at an input of a delay circuit and second instructions to selectively activate a portion of the pre-driver circuit coupled to an output stage of an integrated circuit to provide bias signals to at least a portion of the output stage in response to receiving the look ahead signal. The instructions further include third instructions to turn off the portion of the pre-driver circuit after a period of time has elapsed.

In still another embodiment, a circuit includes a delay circuit including an input for receiving a signal and an output coupled to a first input of an output stage. The circuit further includes a transition detector including a detector input coupled to the input of the delay circuit and a detector output. The transition detector provides a look ahead signal to the detector output in response to each transition within the signal. The circuit also includes a pre-driver circuit including a control input and including at least one bias output coupled to a second input of the output stage. Further, the circuit includes a controller having an input coupled to the detector output and an output coupled to the control input of the pre-driver circuit. The controller controls the pre-driver circuit to selectively increase a driving strength of signals and bias applied to the output stage in response to the look ahead signal.

BRIEF DESCRIPTION OF THE DRAWINGS

In the following description, the use of the same reference numerals in different drawings indicates similar or identical items.

DETAILED DESCRIPTION OF ILLUSTRATIVE EMBODIMENTS

There are numerous techniques for using pulse width modulated signals (PWM). With an analog-type pre-driver circuitry, switching of the PWM signals (from a logic low level to a logic high level and vice versa) only turns off some portions of the circuitry automatically, while other portions may continue to draw power. One example of a PWM modulation technique is sometimes referred to as "BD modulation", which is described below with respect to a timing diagram of FIG. 1.

Figure 1:
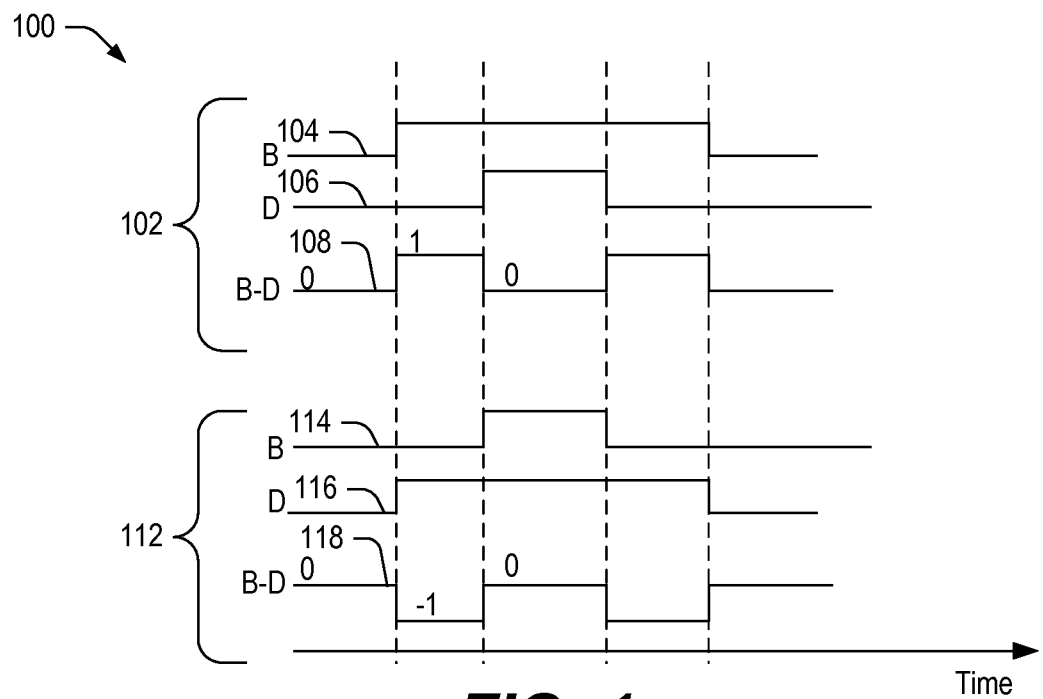
FIG. 1 is timing diagram depicting representative examples of BD PWM modulated signals and their respective differential output signals.

FIG. 1 is timing diagram 100 depicting representative examples of BD PWM modulated signals (B and D) and their respective differential output signals. The BD PWM signals 102 include a B signal 104 and a D signal 106, and the analog signal is formed by subtracting the D signal 106 from the B signal 104 to produce a B-D signal 108. Since the B signal 104 is positive during the period where the D signal 106 signal is positive, the B-D signal 108 varies between 0 and 1 as shown.

BD PWM signals 112 include a B signal 114 and a D signal 116, and the analog signal is formed by subtracting the D signal 116 from the B signal 114 to produce the B-D signal 118. Since the B signal 114 is positive for only a short duration while the D signal 116 signal is positive, the B-D signal 118 varies between 0 and −1 as shown. Thus, the PWM system varies the widths of the signal pulses to control the value of the analog output.

Typically, BD PWM signals 102 and 112, such as those depicted in FIG. 1, can be used to drive an H-Bridge, a power supply or another type of inductive load, to achieve high power and high efficiency amplification. One possible application of an H-Bridge circuit that can be driven using BD encoded signals is described below with respect to FIG. 2.

Figure 2:
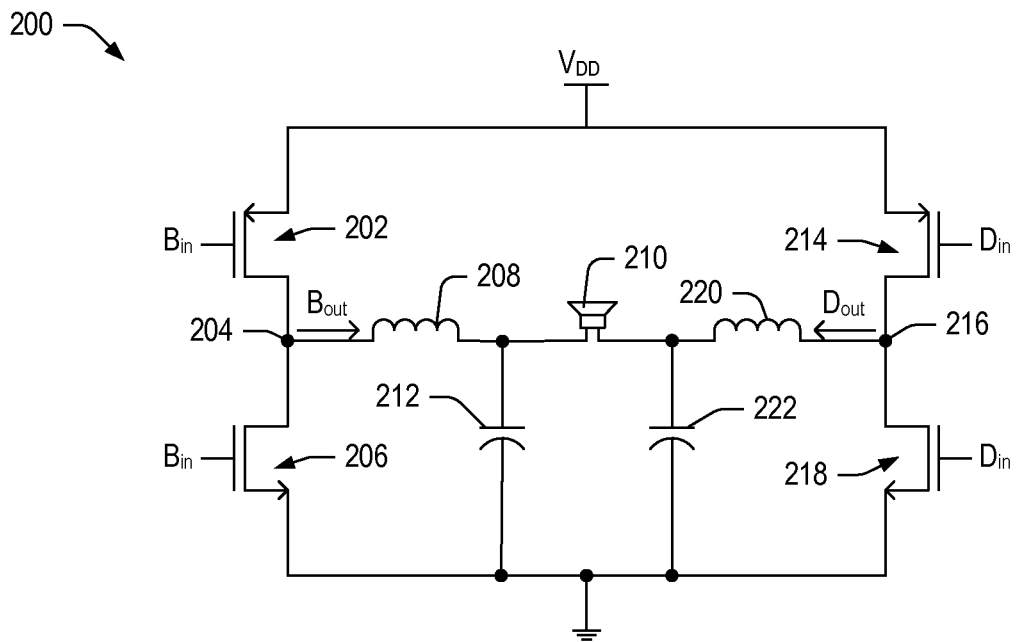
FIG. 2 is a block diagram of a circuit including a simplified embodiment of an H-Bridge.

FIG. 2 is a block diagram of a circuit 200 including a simplified embodiment of an H-Bridge having output nodes 204 and 216. The H-Bridge includes transistors 202, 206, 214, and 218 and output nodes 204 and 216. The H-Bridge is coupled to a first power supply terminal ($V_{DD}$) and to a second power supply terminal, such as ground. Output nodes 204 and 216 are coupled to inductors 208 and 220, which are coupled to a speaker 210.

Transistor 202 includes a source connected to the first power supply terminal ($V_{DD}$), a control terminal for receiving B-signal 104 or 114, and a drain connected to output node 204. Transistor 206 includes a drain connected to output node 204, a control terminal for receiving B-signal 104 or 114, and a source connected to the second power supply terminal, i.e., ground. Transistor 214 includes a source connected to the first power supply terminal ($V_{DD}$), a control terminal for receiving D-signal 106 or 116, and a drain connected to output node 216. Transistor 218 includes a drain connected to output node 216, a control terminal for receiving D-signal 106 or 116, and a source connected to the second power supply terminal.

Inductor 208 includes a first terminal connected to output node 204 and a second terminal connected to a first input of speaker 210 and to a first current electrode of a capacitor 212. Capacitor 212 includes a second current electrode connected to the second power supply terminal. Inductor 220 includes a first terminal connected to output node 216 and a second terminal connected to a second input of speaker 210 and to a first current electrode of a capacitor 222. Capacitor 222 includes a second current electrode connected to the second power supply terminal.

In an example, transistors 202 and 206 should not be activated at the same time or they would operate to short the first power supply terminal to the second power supply terminal causing a shoot through current. Similarly, transistors 214 and 218 should not be activated at the same time or they would also operate to short the first power supply terminal to the second power supply terminal causing a shoot through current. In a particular example, when the Bin signal is high, transistor 202 is off and transistor 206 allows current to flow from output node 204 to the second power supply terminal. At the same time, if the Din signal is a logic low level, transistor 214 allows current to flow from the first power supply terminal ($V_{DD}$) to output node 216 and transistor 218 is off. In this instance, the Bin and Din signals control the H-bridge to allow current flow from the first power supply terminal ($V_{DD}$) to the second power supply terminal (i.e., ground) through transistor 214, inductor 220, speaker 210, inductor 208 and transistor 206. When both signals are logic high or logic low, output nodes 204 and 216 are driven and/or pulled to a substantially equal value.

In this instance, current may still flow because the inductors 208 and 220, which are relatively large (such as approximately 20 uH), will oppose a sudden current change. From a perspective of a PWM cycle to PWM cycle (the example of FIG. 1 represents a single cycle), the load current remains substantially unchanging. In the example of B-D signals 102 in FIG. 1, even when the B signal 104 and D signal 106 are equal (i.e., B=D=0 or B=D=1), the load current flows to speaker 210, maintained by the energy stored on the inductors 208 and 220, and that current is substantially constant. Even in an example where the BD signal 102 is applied for a long time and then the signal is switched to BD signal 112, it will take some time (such as approximately 5 us) for the load current settle down to the new load current value. Further, because the B-D signals 102 and 112 represent PWM encoded audio signals, the rate of change is very slow (such as a maximum frequency of approximately 20 kHz) as compared to the PWM frequency (approximately 1 MHz). In other words, a transition from BD signal 102 to BD signal 112 would occur smoothly through several PWM cycles.

In an example, the H-Bridge or other output stages drive the BD modulated PWM signal as a pure digital signal with very fast edges at output nodes 204 and 216, which fast edges have the advantage of very short propagation times and good distortion performance. This allows the H-Bridge to operate in open loop without referring to feedback for reducing distortion. Further, driving the PWM signal as a digital signal translates into efficiency because the digital signal provides low shoot-through current and low power consumption for the pre-driver circuit that generates the B signal 104 and 114 and the D signal 106 and 116.

However, the fast transitions generate strong electromagnetic interferences (EMI). With the introduction of feedback in state of the art amplifiers, the pre-driver circuits can use slew rate-controlled pulse edges without penalizing total harmonic distortion (THD) to improve the EMI performance. In particular, as described below with respect to FIG. 3, slow edges introduce a spectral notch at frequencies equal to one over the rise/fall time ($\tau$).

Figure 3:
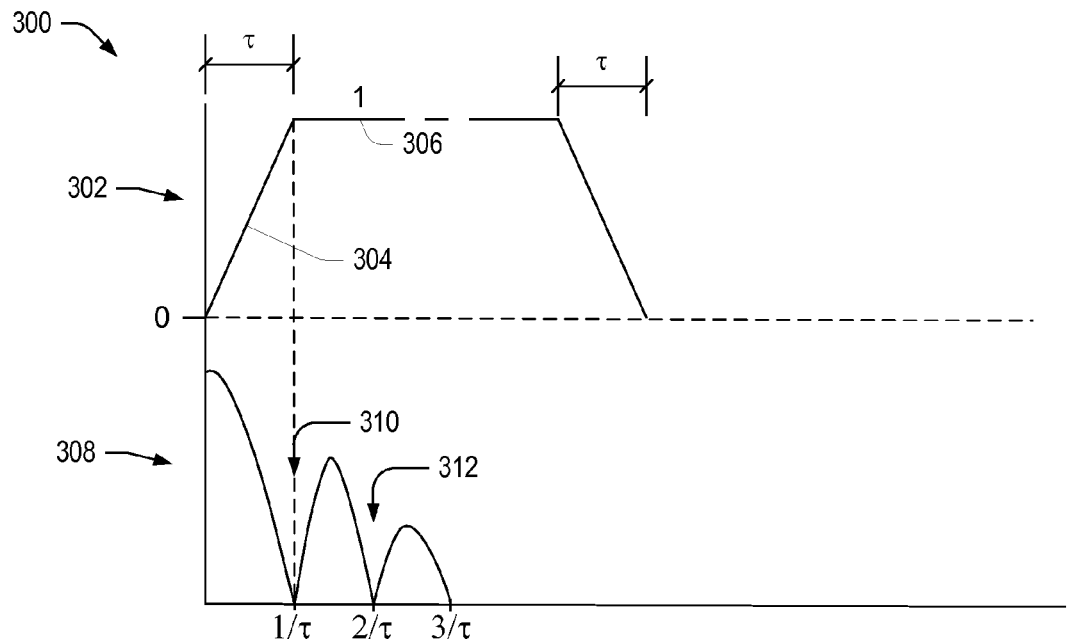
FIG. 3 is a timing diagram depicting a representative example of a PWM pulse having slew rate-controlled edges and a resulting output signal with spectral nulls at a frequency equal to one over the rise/fall time and their harmonics.

FIG. 3 is a timing diagram 300 depicting a representative example of a PWM pulse 302 having slew rate-controlled transition edges 304 and a resulting output signal 308 with spectral nulls 310 and 312 at a frequency of one over the rise/fall time ($1/\tau$) and its harmonics. As shown, PWM pulse 302 has a rise time ($\tau$) during which the amplitude of the pulse increases from zero to one (at transition edge 304). This particular PWM pulse 302 also has a fall time ($\tau$); however, the slew rate of the rise and fall edges may be different. To achieve some EMI improvement at FM frequencies using slew rate-based control, the rise and fall times ($\tau_{Rise}$, and $\tau_{Fall}$) may be chosen to be around 10 to 20 nanoseconds, which is a period of time that exceeds a typical worst-case timing.

Unfortunately, a slew rate-controlled edge includes the challenge of controlling the shoot through current, which adds complexity to the circuitry. Further, the slew rate-controlled edge implies the use of an analog pre-driver, which consumes power. Both the shoot through current and the analog-pre-driver can impact on the overall efficiency of the circuit.

Embodiments of circuits and methods are described below that reduce power consumption of an analog pre-driver circuit for an H-Bridge, improving the overall efficiency of the output stage. Since a pulse width modulated (PWM) signal is a digital signal (even considering the slew rate controlled edges), circuits and methods described below draw current from the supply during edge transitions of the PWM signal (excluding load currents), but draw substantially less current (or no current) under static conditions. An example of a circuit configured to reduce static power consumption is described below with respect to FIG. 4.

Figure 4:
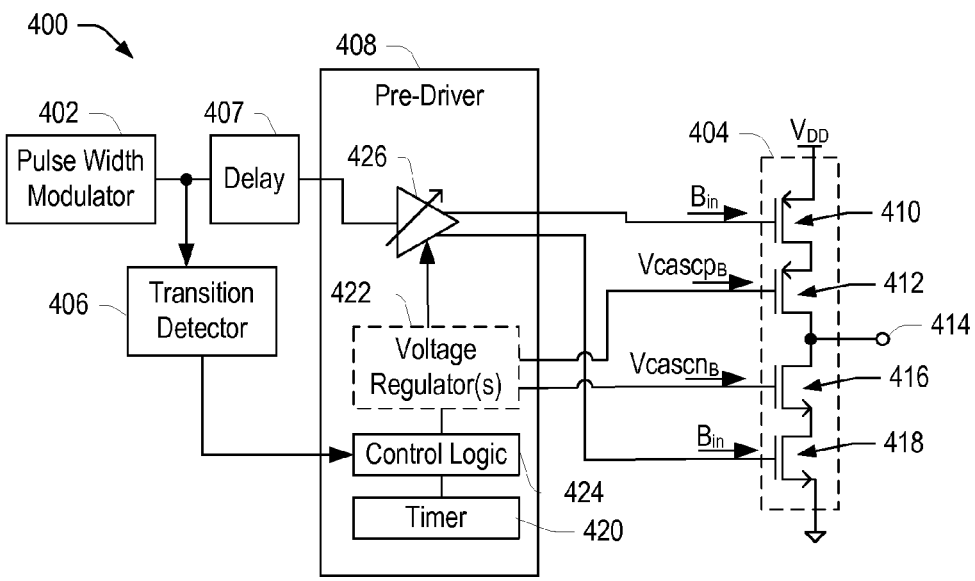
FIG. 4 is a partial block diagram and partial circuit diagram of an embodiment of receiver circuit including a pre-driver circuit and a controller configured to control power consumption by dynamically biasing at least a portion of the pre-driver circuit.

FIG. 4 is a partial block diagram and partial circuit diagram of an embodiment of a receiver circuit 400 configured to control power consumption by dynamically biasing at least a portion of an output stage 404. Circuit 400 includes a pulse width modulator 402 configured to generate a digital signal, such as a B PWM signal ($B_{in}$), which is provided to an input of a delay circuit 407 that includes an output connected to an input of pre-driver circuit 408, which has multiple outputs connected to output stage 404. Circuit 400 further includes a transition detector circuit 406, which includes an input connected to the input of the delay circuit 407 and an output connected to a second input of pre-driver circuit 408.

Pre-driver circuit 408 includes an adjustable buffer circuit 426 including an input connected to delay circuit 407, a control input, a first output, and a second output. Pre-driver circuit 408 further includes one or more voltage regulators 422 including a control output coupled to the control input of adjustable buffer circuit 426, a first output, a second output, and a control input. The control input of the one or more voltage regulators 422 is coupled to an output of control logic 424, which is coupled to a timer 420.

Output stage 404 includes p-channel metal oxide semiconductor (PMOS) transistors 410 and 412, n-channel MOS (NMOS) transistors 416 and 418, and an output terminal 414, which can be connected to a load. PMOS transistor 410 includes a source connected to a first power supply terminal ($V_{DD}$), a control terminal connected to the first output of adjustable buffer circuit 426, and a drain. PMOS transistor 412 includes a source connected to the drain of PMOS transistor 410, a control terminal connected to a first output of one or more voltage regulators 422, and a drain connected to output terminal 414. NMOS transistor 416 includes a drain connected to output terminal 414, a control terminal connected to the second output of the one or more voltage regulators 422, and a source. NMOS transistor 418 includes a drain connected to the source of NMOS transistor 416, a control terminal connected to the second output of adjustable buffer circuit 426, and a source connected to a second power supply terminal, such as ground.

In an example, pulse width modulator 402 generates a digital signal ($B_{in}$) and applies the digital signal ($B_{in}$) to the input of delay circuit 407. Transition detector circuit 406 detects transitions within the digital signal ($B_{in}$) at the input of the delay circuit 407, while delay circuit 407 delays the transition and generates a look ahead signal, which is provided to control logic 424 of pre-driver circuit 408, for each transition. Control logic 424 resets and starts timer 420 in response to the transition of the delayed signal and controls one or more voltage regulators 422 to apply a bias voltage to the control terminals of PMOS transistor 412 and NMOS transistor 416. In a particular example, the time period between detection of the transition and receipt of the transition by adjustable buffer circuit 426 (after the delay applied by delay circuit 407) is sufficient to allow the bias voltages to fully activate PMOS transistor 412 and NMOS transistor 416 before the adjustable buffer circuit 426 provides the signals to the gates of PMOS transistor 410 and NMOS transistor 418. Once a value of timer 420 exceeds an elapsed time threshold, control logic 424 controls voltage regulators 422 to reduce driving strength to PMOS transistor 412 and NMOS transistor 416 until a next transition is detected.

In a particular example, voltage regulators 422 selective apply bias signals to control terminals of transistors 412 and 416 to increase a driving strength of the voltage regulators 422 that drive the bias voltages (Vcascn and Vcascp) so the bias voltages do not vary much when a transition reaches the output terminal 414. Such variation (bouncing) occurs due to parasitic capacitance coupling.

Further, in a particular example, the control logic 424 selectively powers portions of the voltage regulators 422 to supply the bias voltages in response to the look ahead signal and reduces power to the portions of the voltage regulators 422 after a period of time. By selectively reducing power to portions of voltage regulators 422, overall power consumption by the pre-driver circuit 408 is reduced.

During operation, if transistor 412 is biased in a linear region, output stage 404 drives power from the first power supply terminal ($V_{DD}$) into the output terminal 414. However, in some instances, as the level of the voltage at the output terminal 414 approaches the desired output voltage level, the bias voltage applied to the gate of transistor 412 can be reduced (or at least less tightly controlled) by voltage regulators 422 of pre-driver circuit 408, reducing current flow within portions of voltage regulators 422 without sacrificing performance. By reducing the current flow into the output terminal 414 when the voltage level at the output terminal 414 reaches a threshold voltage level, overall power consumption can be reduced.

Since the PWM signal is a digital signal, even if the PWM signal has slew rate controlled transitions, as depicted in FIG. 3, output stage 404 draws current from the power supply terminals only during edge transitions (excluding load current) and draws no current when the digital signal ($B_{in}$) is static. This can be achieved using the configuration of the illustrated output stage 404. However, this edge transition-based consumption should also extend to the pre-driver circuit 408, such that power consumption is reduced when the input signal is not transitioning. With a digital pre-driver circuit (i.e., without digital voltage regulators), this transition-only power consumption can be automatically achieved. However, with analog-type pre-driver circuitry, only some parts of the circuit turn off or consume less current automatically when the input signal transitions, while other parts continue to consume power. In an embodiment, the bias voltages (Vcasp$_B$ and Vcascn$_B$) are maintained at a level such that the voltage limits of PMOS transistor 412 and NMOS transistor 416 are not exceeded.

In the illustrated example, control logic 424 operates as a controller that is internal to pre-driver circuit 408; however, in some embodiments, control logic 424 may be external to pre-driver circuit 408. In an example, control logic 424 may be implemented by a processor, such as a microcontroller unit, a digital signal processor, or another type of processor configurable to execute instructions. In such an instance, control logic 424 may be implemented as processor readable instructions stored on a memory (such as memory 507 in FIG. 5).

While the circuit 400 of FIG. 4 depicts an output stage with half of an H-Bridge, the technique may be applied to a full H-Bridge implementation to reduce overall power consumption. An example of a circuit including an output stage having an H-Bridge is described below with respect to FIG. 5.

Figure 5:
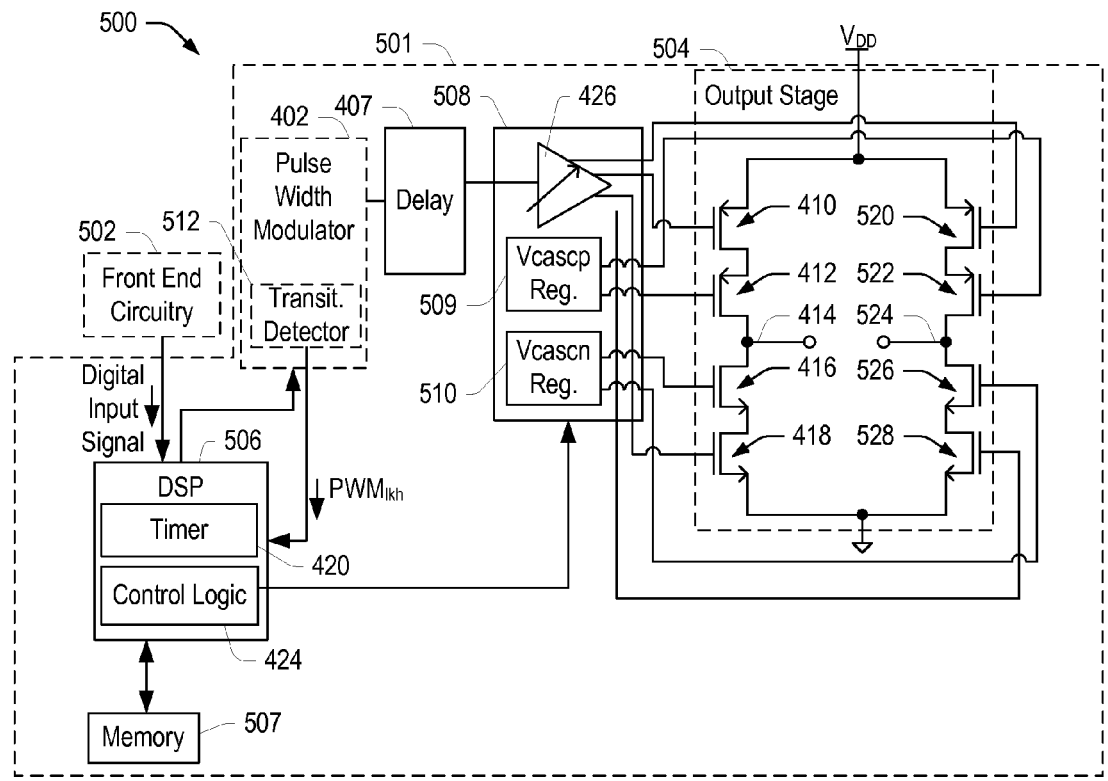
FIG. 5 is a partial block diagram and partial circuit diagram of an embodiment of a system including a circuit with a controller configured to control power consumption by dynamically biasing at least a portion of a pre-driver circuit.

FIG. 5 is a partial block diagram and partial circuit diagram of an embodiment of a system 500 including an amplifier circuit 501 having a controller configured to control power consumption by dynamically biasing at least a portion of a pre-driver circuit 508. System 500 includes front end circuitry 502 for receiving an input signal and for providing a processed digital input signal to amplifier circuit 501. Amplifier circuit 501 includes a digital signal processor (DSP) 506 including a first input connected to front end circuitry 502, a second input connected to an edge detector 512 of pulse width modulator 402, a first output connected to pulse width modulator 402, and outputs connected to pre-driver circuit 508. DSP 506 is also connected to a memory 507, which stores processor readable instructions that can be executed by DSP 506. Pulse width modulator 402 includes an output connected to an input of delay circuit 407, which has an output connected to pre-driver circuit 508. While this embodiment includes a pulse width modulator circuit 402, in some instances, the signal source may be external to the circuit 501. Further, other types of signals with transitions may also serve as the input signal to the output stage 504.

Pre-driver circuit 508 includes adjustable buffer 426 including an input connected to an output of delay circuit 407, and multiple outputs connected to output stage 504. Pre-driver circuit 508 further includes voltage regulators 509 and 510, which have outputs connected to output stage 504.

Output stage 504 includes PMOS transistors 410, 412, 520, and 522, NMOS transistors 416, 418, 526, and 528, and output nodes 414 and 524. PMOS transistor 410 includes a source connected to the first power supply terminal ($V_{DD}$), a control terminal for receiving a first digital signal from adjustable buffer 426, and a drain. PMOS transistor 412 includes a source connected to the drain of PMOS transistor 410, a control terminal connected to PMOS bias voltage regulator 509 for receiving cascade PMOS bias voltage signal ($Vcascp_B$), and a drain connected to output terminal 414. NMOS transistor 416 includes a drain connected to output terminal 414, a control terminal connected to NMOS bias voltage regulator 510 for receiving the cascade NMOS bias voltage ($Vcascn_B$), and a source. NMOS transistor 418 includes a drain connected to the source of transistor 416, a control terminal for receiving a second digital input signal from adjustable buffer 426, and a source connected to a second power supply terminal, such as ground.

PMOS transistor 520 includes a source connected to a power supply terminal (VDD), a control terminal for receiving a third digital input signal from adjustable buffer 426, and a drain. PMOS transistor 522 includes a source connected to the drain of transistor 520, a control terminal connected to PMOS bias voltage regulator 509 for receiving a cascade PMOS bias voltage signal ($Vcascp_D$), and a drain connected to output node 524. NMOS transistor 526 includes a drain connected to output node 524, a control terminal connected to NMOS bias voltage regulator 510 for receiving a cascade NMOS bias voltage ($Vcascn_D$), and a source. NMOS transistor 528 includes a drain connected to the source of transistor 526, a control terminal for receiving the fourth digital input signal from adjustable buffer 426, and a source connected to a second power supply terminal, such as ground.

In an example, control logic 424 and timer 420 cooperate to control pre-driver circuit 508, parts of which can be turned off and on, selectively, to reduce overall, static power consumption in circuit 501. In an example, control logic 424 activates the voltage regulators 509 and 510 in response to the transition detection signal from transition detector 512, which causes voltage regulators 509 and 510 to apply stronger bias signals to the gates of PMOS transistors 412 and 522 and to NMOS transistors 416 and 526 before the pulse edge transition reaches the gates of PMOS transistors 410 and 520 and of NMOS transistors 418 and 528.

In a particular example, front end circuitry 502 includes filters, channel detectors, amplifiers, and analog-to-digital converters, among other circuitry, for providing a digital input signal to DSP 506. DSP 506 may control pulse width modulator 402 to provide the first and second digital signals to delay circuit 407, which delays the digital signals and provides the delayed signals to pre-driver circuit 508. Pulse width modulator 402 includes an edge detector 512 configured to detect transitions within the digital signals (PWM signals) generated by pulse width modulator 402. Edge detector 512 detects such transitions and provides a PWM look-ahead signal ($PWM_{lkh}$) to DSP 506 in response to detecting each transition. DSP 506 includes a timer 420 and control logic 424. The control logic 424 controls operation of voltage regulators 509 and 510 in response to receipt of the $PWM_{lkh}$ signal. Timer 420 resets and initiates a timer operation in response to the delayed transition within the signal, and control logic 424 controls voltage regulators 509 and 510 of pre-driver circuit 408 to selectively bias PMOS transistors 412 and 522 and NMOS transistors 416 and 526 of output stage 504. The delay provided by delay circuit 407 is sufficient to allow the portions of the pre-driver circuit 408 to reach full power and to provide bias signals to transistors 412, 416, 522, and 526 of output stage 504. Once the timer 420 reaches a pre-determined threshold, control logic 424 may decrease the driving strength (therefore reducing power consumption) of bias voltages to the gates of PMOS transistor 412 and 522 and NMOS transistors 416 and 526 of output stage 504.

In an example, DSP 506 provides a channel output signal to pulse width modulator 402, which produces a B PWM signal and a D PWM signal in response to receiving the channel output signal. Edge detector 512 detects the timing of the transition edges within the B and D PWM signals and provides the $PWM_{lkh}$ signal to DSP 506 for each rising edge transition and each falling edge transition.

In response to receiving a $PWM_{lkh}$ for either the rising edge transition or the falling edge transition, control logic 424 controls voltage regulators 509 and 510 of pre-driver circuit 508 to provide a strong bias to PMOS transistors 412 and 522 and to NMOS transistors 416 and 526 and to prepare the output stage 504 to receive the transitions. At the same time it also increases the driving strength of the adjustable buffer 426. Further, in response to a delayed transition from the output of delay circuit 407, the DSP 506 resets timer 420, which begins counting. Once a value of the timer 420 reaches an elapsed time threshold, control logic 424 turns off or reduces power to a portion of pre-driver circuit 508, reducing the strength of the bias signal at the control terminals of PMOS transistors 412 and 522 and NMOS transistors 416 and 526. It also reduces the driving strength of the adjustable buffer 426. In particular, when the B PWM and D PWM signals are static (unchanging), control logic 424 controls pre-driver circuit 508 to reduce power consumption in regulators 509 and 510 and adjustable buffer 426, reducing static power consumption by the pre-driver circuit during periods when the PWM signal is static.

In a particular example, DSP 506 accesses a memory 507 (a processor readable medium), such as a read only memory, a flash memory, or other memory component that can store processor readable instructions. In a particular example, memory 507 is a processor readable medium that embodies instructions that, when executed by a processor (such as DSP 506, a microcontroller unit, a general purpose processor, or other data processing unit), cause the processor to control a pre-driver circuit to dynamically bias an output stage of an integrated circuit. The instructions include first instructions to receive a look ahead signal indicating a transition within an input signal that is delayed by a delay circuit 407 coupled to the input of pre-driver circuit 508, which is coupled to output stage 504 of an integrated circuit 501 and second instructions to activate a portion of the pre-driver circuit 508 to bias/drive strongly the output stage in response to receiving the look ahead signal. The instructions further include third instructions to turn off the portion of the pre-driver circuit 508 after a period of time.

In an embodiment, the instructions further include fourth instructions to initiate a timer 420 in response to receiving a delayed transition from delay circuit 407 and fifth instructions to compare an elapsed time value of the timer 420 to a pre-determined threshold and to execute the third instructions when the elapsed time value exceeds the pre-determined threshold. In an example, the first instructions cause DSP 506 to receive a second look ahead signal indicating that a second transition within the input signal is about to be received at the output stage. The instructions may include fifth instructions to reset the timer when a next transition is detected within the input signal before the elapsed time value has exceeded the pre-determined threshold. In this instance, the timer 420 may be implemented in software. Further, in response to a second transition of the input signal before the elapsed time of the timer exceeds the pre-determined threshold, the second instructions can cause the DSP 506 to maintain activation of the portion of the pre-driver circuit 508 until the elapsed time of the timer 420 exceeds the pre-determined threshold.

Thus, circuit 501 uses a look-ahead technique for identifying transitions within the PWM signal while delaying the PWM signal so that the controller (DSP 506 executing software from memory 507, a microprocessor, or other control logic circuitry) and the pre-driver circuit 508 can operate to apply stronger bias voltages to the control terminals of PMOS transistors 412 and 522 and NMOS transistor 416 and 526 and to increase the driving strength of the adjustable buffer 426 before the PWM signal reaches the output stage 504. This enables the pre-driver circuit to fully power the output stage just in time for the output stage 504 to receive the transition edge of the PWM signal.

While edge detector 512 is depicted as being included within pulse width modulator 402, edge detector 512 may be a separate element of circuit 501. Further, while the above-description suggests that DSP 506 is responsive to edge detector 512 for controlling the regulators 509 and 510 of pre-driver circuit 508, in another embodiment, a separate controller (such as a microcontroller unit (not shown)) may be included that is separate from DSP 506 and that is configured to control pre-driver circuit 508 in response to PWM$_{lkh}$ signal from edge detector 512 and in response to timer 420. Another example of a system including a circuit having two output stages that is configured to reduce power consumption is described below with respect to FIG. 6.

Figure 6:
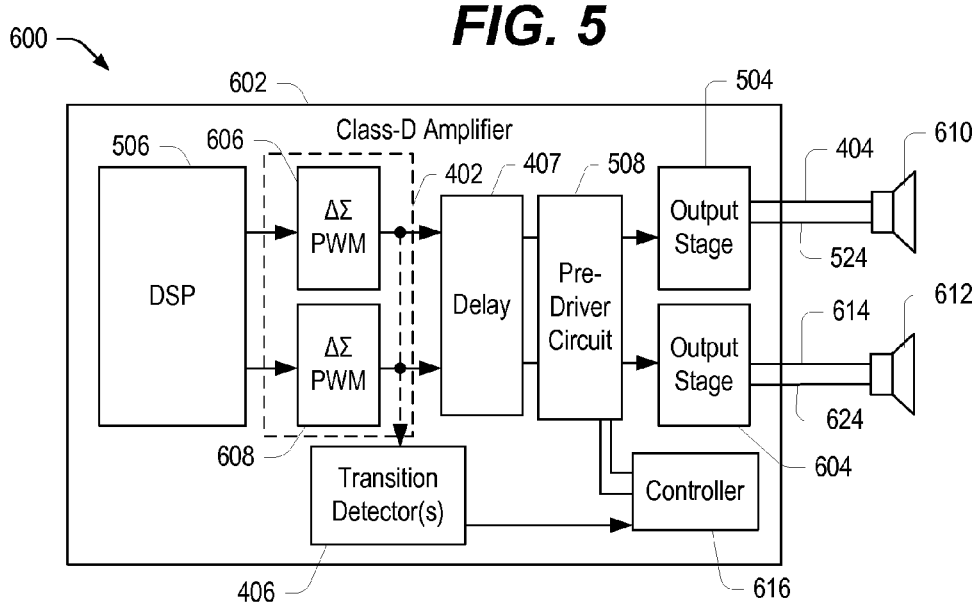
FIG. 6 is a block diagram of a portion of an embodiment of the system of FIG. 5 implemented as a class-D amplifier circuit configured to reduce overall power consumption by dynamically biasing at least a portion of each of two output stages.

FIG. 6 is a block diagram of a portion of an embodiment of the system of FIG. 5 implemented as a class-D amplifier circuit 602 configured to reduce overall power consumption by dynamically biasing at least a portion of each of two output stages 504 and 604. System 600 includes speakers 610 and 612. Speaker 610 includes a first input connected to output terminal 414 and a second input connected to output node 524 of output stage 504. Speaker 612 includes a first input connected to a first output node 614 and a second input connected to a second output node 624 of output stage 604. Output stage 604 is the same as output stage 504 in FIG. 5. Circuit 602 includes DSP 506 connected to pulse width modulator 402, which includes a first sigma-delta pulse width modulation (PWM) circuit 606 and a second sigma-delta PWM circuit 608, which have outputs connected to inputs of pre-driver circuit 508, respectively. Pre-driver circuit 508 includes outputs connected to output stages 504 and 604, respectively.

Circuit 602 further includes one or more transition detector circuits 406 (or edge detectors 512) for detecting transitions in the PWM signals from first and second sigma-delta PWM circuits 606 and 608 before the transitions are received at output stages 404 and 604. The one or more transition detector circuits 406 provide look ahead signals to controller 616, which controls one or more circuit elements of pre-driver circuit 508, such as by selectively coupling one or more transistors in parallel to allow current to flow through switchable current flow paths within a current mirror circuit. The resulting output current from pre-driver circuit 508 can be applied to the control terminals of transistors within output stages 504 and 604 to apply stronger bias voltages to the control terminals of output stages 404 and 604 in response to detecting transitions in the PWM signals.

In this example, controller 616 controls voltage regulators (such as voltage regulators 509 and 510 in FIG. 5) to selectively turn on and off current flow through portions of the regulators 509 and 510 to apply a bias signal to control terminals of transistors within output stages 504 and 604. As previously discussed, controller 616 relies on a look-ahead signal to determine timing of a transition within a PWM pulse and controls the pre-driver circuit 508 to strongly bias the output stages 504 and 604 just before the PWM transition is received. After a period of time, controller 616 controls the pre-driver circuit 508 to turn off power or reduce power to the portions of the pre-driver circuit 508, reducing or lowering the strength of the bias signal applied to output stages 504 and 604 and reducing overall static power consumption of the circuit 602 (and of pre-driver circuit 508 in particular).

In a particular example, controller 616 controls current flow through circuit elements of the pre-driver circuit 508 to strongly bias output stages 504 when a PWM signal from sigma-delta PWM circuit 606 transitions and to reduce current flow through the circuit components of the pre-driver circuit 508 when the PWM signal is static. Similarly, controller 616 provides stronger bias to portions of output stages 604 when a PWM signal from sigma-delta PWM circuit 608 transitions and to turn off power when the PWM signal is static.

While the illustrated embodiment of FIG. 6 includes a transition detector circuit 406 separate from pulse width modulator 402, in other embodiments the transition detector circuit 406 may be included within the pulse width modulator 402 or individually within each of the sigma-delta PWM circuits 606 and 608. Further, the one or more transition detector circuits 406 may be edge detectors configured to detect transitions before the transitions are received by output stages 504 and 604. An example of one possible embodiment of a portion of the pre-driver circuit 508 including a voltage regulator circuit is described below with respect to FIG. 7.

Figure 7:
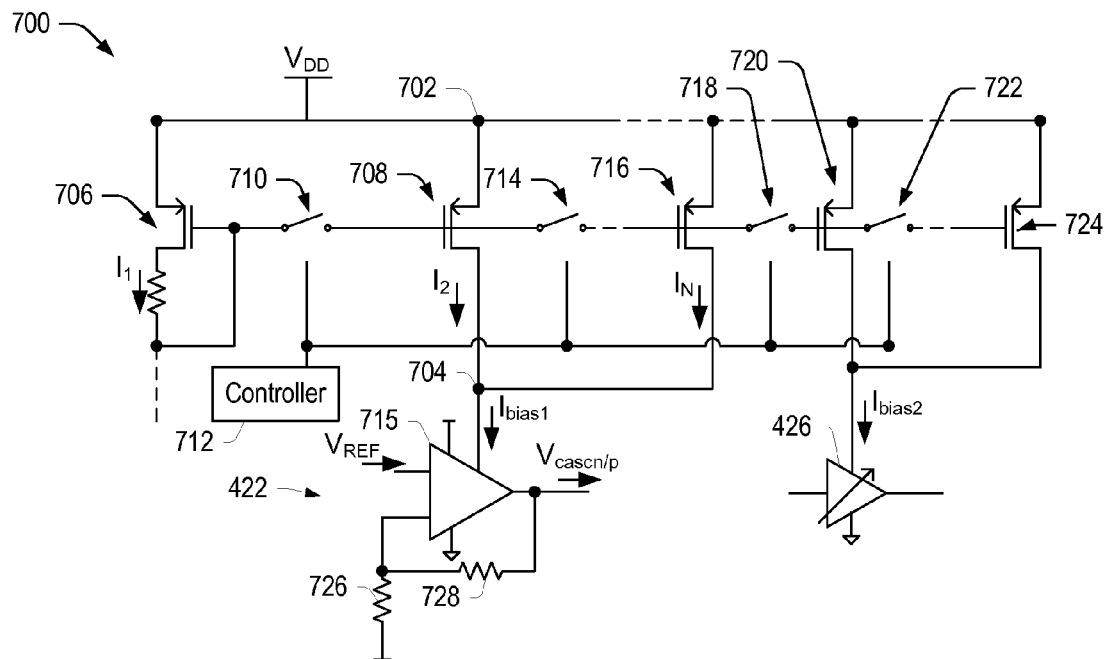
FIG. 7 is a partial block diagram and partial circuit diagram of a portion of the biasing circuit for a pre-driver circuit including a voltage regulator that can be used with the circuits of FIGS. 4-6 to provide dynamic biasing of at least a portion of an output stage.

FIG. 7 is a partial block diagram and partial circuit diagram of a portion of a biasing circuit 700 of a pre-driver circuit 508 including a voltage regulator 422 that can be used with the circuits 400, 501, and 602 of FIGS. 4-6 to provide dynamic biasing of at least a portion of an output stage. Biasing circuit 700 is implemented as a current mirror having an adjustable current gain. In particular, biasing circuit 700 includes a transistor 706 including a source connected to a first node 702, which is connected to a power supply terminal ($V_{DD}$). Transistor 706 further includes a gate, and a drain, which is connected to a first terminal of a resistor 707 that has a second terminal connected to the gate. Biasing circuit 700 further includes a transistor 708 including a source connected to node 702, a gate, and a drain connected to a node 704. The gates of transistor 706 and 708 may be selectively connected through a switch 710, which has a first current electrode connected to the gate of transistor 706, a control terminal connected to a controller 712, and a second current electrode connected to a gate of transistor 708. Biasing circuit 700 further includes a switch 714 including a first terminal connected to the gate of transistor 708, a control terminal connected to controller 712, and a second current electrode connected to a gate of a transistor 716, which has a source connected to node 702 and a drain connected to node 704. Transistor 706 provides a first current ($I_1$), and transistors 708 and 716 provide drain currents ($I_2$ and $I_N$), which are proportional to the first current ($I_1$), which currents contribute to a first bias current ($I_{bias1}$). Dashed lines are included to indicate that any number of switches, such as switch 714, and transistors, such as transistor 716 may be included to contribute to the first bias current ($I_{biaas1}$), which flows from node 704 and into voltage regulator 422.

Voltage regulator 422 includes an amplifier 715 (implemented to regulate a volate) having a first input (voltage reference input) for receiving a reference voltage ($V_{REF}$), a second input (feedback input) for receiving a feedback voltage, supply terminals, a bias input for receiving the first bias current ($I_{bias1}$), and an output for providing a bias voltage (Vcascn or Vcascp) for biasing at least one of transistors 412, 416, 522, and 526 in FIG. 5. The output of amplifier 715 is connected to a first terminal of a resistor 728, which has a second terminal connected to the second input of amplifier 715. Further, a resistor 726 includes a first terminal connected to the second input of amplifier 715 and a second terminal connected to ground.

Biasing circuit 700 further includes a switch 718 having a first terminal connected to a gate of transistor 716, a control terminal connected to controller 712, and a second terminal connected to a gate of a transistor 720. Transistor 720 further includes a source connected to node 702 and a drain connected to a node 725. Biasing circuit 700 further includes a switch 722 having a first terminal connected to the gate of transistor 720, a control terminal connected to controller 712, and a second terminal, which is connected to a gate of another transistor, such as transistor 724. Transistor 724 includes a source connected to node 702, a drain connected to node 725, and a gate connected to the second terminal of a switch, such as switch 722. Transistors 720 and 724 have drain currents, which contribute to a second bias current (Ibias2) that flows from node 725 to adjustable buffer circuit 426. Adjustable buffer circuit 426 further includes a first terminal connected to node 725 for receiving the second bias current ($I_{bias2}$), a terminal connected to ground, an input connected to an output of delay circuit 407, and an output coupled to the gate of at least one of transistors 410, 418, 520, and 528. As indicated by the dashed lines, any number of switches and transistors may be included that can contribute drain currents to the second bias current ($I_{bias2}$).

In an example, biasing circuit 700 can include an array of transistors having their sources and drains connected to nodes 702 and 704, respectively, and having gates that are selectively connected to other gates within the array. Any number of transistors can be provided and selectively biased to alter the effective gain of the mirrored output bias currents ($I_{bias1}$ and $I_{bias2}$).

In the illustrated example, transistor 706 is diode-connected and biased to conduct a first current ($I_1$). If controller 712 biases switch 710 to couple the gate of transistor 706 to the gate of transistor 708, a second current ($I_2$) flows through transistor 708 that is proportional to the first current ($I_1$). The proportionality of the second current ($I_2$) is determined by the relative differences between the channel lengths, widths, thresholds voltages, and other parameters of transistor 708 relative to transistor 706. If the lengths, widths, thresholds, and voltages are substantially equal, the second current ($I_2$) should substantially equal the first current ($I_1$). However, controller 712 may selectively activate one or more other transistors, such as transistor 716, using one or more switches, such as switch 714, to produce multiple currents (including second current ($I_2$) and other currents including current ($I_N$), which can be combined to provide the first bias current ($I_{bias1}$). Further, controller 712 selectively activates other transistors, such as transistors 720 and 724, by activating switches 718 and 722 to provide a second bias current ($I_{bias2}$) for biasing adjustable buffer circuit 426.

In an example, in response to a $PWM_{lkh}$ signal indicating that a transition is about to be received, the controller 712 activates switches 710 and 714 to allow the second current ($I_2$) and the n-th current ($I_N$) to contribute to the output current level, which can be used to adjust the bias strength of the output stage 504 while the timer signal is received. Increasing the bias current of the voltage regulator 422 increases its driving strength. When the timer signal turns off, controller 712 selectively deactivates switches 710 and 714, reducing current flow through transistors 708 and 716 and correspondingly reducing the first bias current ($I_{bias1}$), which reduces the bias strength of the signals applied to the output stage 504.

Controller 712 controls switches 710 and 714 to provide the first bias current ($I_{bias1}$) via a first current path to the regulator 422 to strongly bias transistors 412, 416, 522, and 526 in FIG. 5, in advance of the transition being supplied to output stage 504 by adjustable buffer circuit 426 by delay circuit 407. Further, controller 712 controls switches 718 and 722 to provide the second bias current ($I_{bias2}$) via a second current path to buffer circuit 426 at a time that is appropriate for delivery of the signal from the output of delay circuit 407 to the gates of transistors 410, 418, 520, and 528.

In this example, transistors 706, 708, 716, 720, and 724 represent an adjustable current mirror that is not part of the voltage regulator 422, but rather it provides a biasing scheme to generate a bias current for the voltage regulator 422 and a bias current for adjustable buffer circuit 426. As previously mentioned, controller 712 controls switches 710, 714, 718, and 722 to adjust the bias current, thereby adjusting the driving strength of the bias signals at the output of amplifier 715 and at the output of adjustable buffer circuit 426.

The timer signal may be on for a pre-determined time period that is sufficient to allow the output to reach a desired level based on a slew rate of the output signal. Once the timer signal switches off, controller 712 may turn off switches 710, 714, 718, and 722 to reduce the corresponding bias currents ($I_{bias1}$ and $I_{bias2}$), reducing overall power consumption of biasing circuit 700, amplifier 715 (regulator 422) and adjustable buffer 426.

Biasing circuit 700 takes advantage of the delay provided by delay circuit 407 to increase the first and second bias currents ($I_{bias1}$ and $I_{bias2}$, respectively) in advance of a pulse transition and to decrease the bias currents when the input signal is stable. By selectively adjusting the bias currents, controller 712 selectively increases the drive strength of the amplifier 715 and adjustable buffer 426 in advance of each transition within a signal and reduces the drive strength when the signal is stable, reducing overall power consumption. An example of a timing diagram showing the look ahead signal and other signals is described below with respect to FIG. 8.

Figure 8:
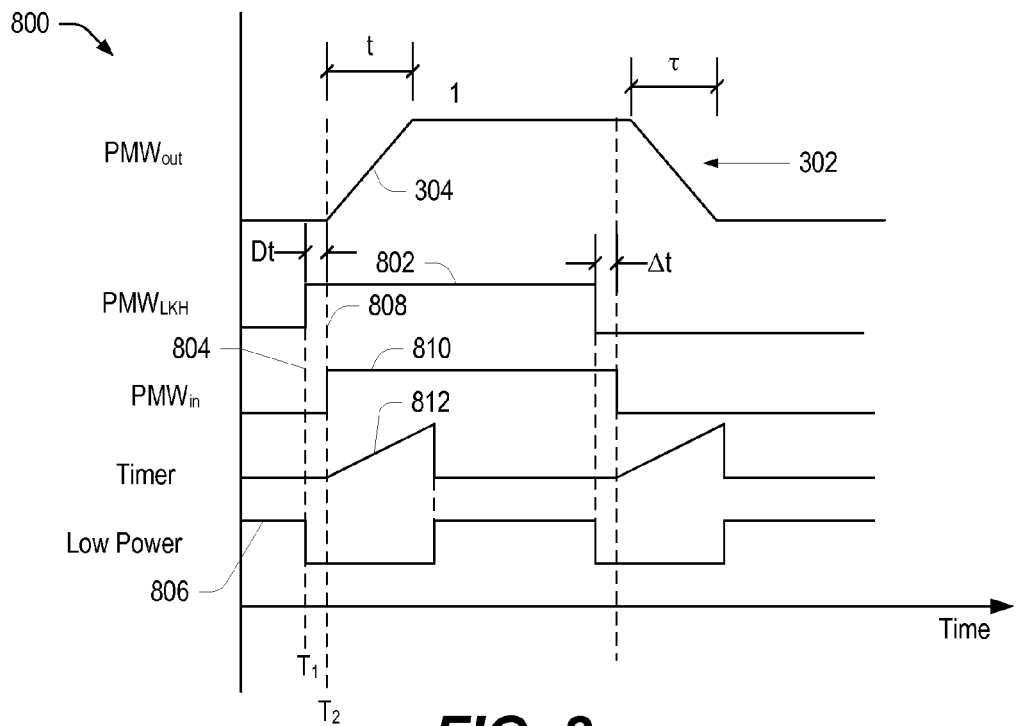
FIG. 8 is a timing diagram of an example of signals used by the amplifier circuits of FIGS. 4-7 to control the power consumption by dynamically biasing at least a portion of an output stage.

FIG. 8 is a timing diagram 800 of an example of signals used by the system of FIGS. 4 and 5 to control the power consumption by dynamically biasing components of the output stage and the PWM pre-driver circuitry. Timing diagram 800 includes a PWM pulse 302 having a slew-rate controlled transition edge 304. Timing diagram 800 further includes PWM pulse 810, $PWM_{lkh}$ signal 802, timer signal 812, and low-power control signal 806.

As previously discussed, edge detector 432 detects the transition edge of the PWM signal at the input of delay circuit 407 and the PWM transition (output of the delay circuit 407) is received at the adjustable buffer circuit 426. As shown in FIG. 8, at time $T_1$ (generally indicated by the dashed line 804), the $PMW_{lkh}$ signal 802 transitions from a logic low level to a logic high level indicating that a PWM signal transition is about to be received at the H-Bridge. When $PWM_{lkh}$ signal 802 transitions, the power control signal 806 also transitions, but from a logic high level indicating a power conservation mode to a logic low level indicating a driver power on mode. In response to the power control signal 806, controller 616 (or control logic 424) controls voltage regulators 509 and 510 supply bias voltages to the gates of transistors 412, 416, 522, and 526 of output stage 504 in FIG. 5. Power control signal 806 causes the controller to put the pre-driver circuit 408 into a full power mode such that, when the PWM input signal's transition is received, the pre-driver circuit 408 is fully on and transistors 412, 416, 522, and 526 of output stage (output stage) 504 are ready to drive the PWM pulse 302. In this instance, the controller can be DSP 506 in FIGS. 5 and 6, controller 616 in FIG. 6, and/or control logic 424 in FIG. 4 or 5. Thus, the look ahead time (Dt) between time $T_1$ and time $T_2$ should be long enough to allow the pre-driver circuit 408 to power up and for the transistors 412, 416, 522, and 526 to become fully powered. On the other hand, the look ahead time (Dt) should be as small as possible to maintain efficiency, which means that care should be taken at the transistor design level with respect to leaving the low-power mode and turning on the pre-driver circuit 408. In the above examples, edge detector 512 or transition detector circuit 406 is used to detect the transitions within a PWM signal before an output stage receives the transitions because of the delay provided by delay circuit 407. In some instances, the delay may introduce non-ideality (noise and/or distortion), and feedback may be used to correct for it.

In an example, each PWM signal transition triggers timer 420, which produces timer signal 812. After some period of time (e.g., a pre-determined period of time or timer threshold), the timer 420 resets, causing timer signal 812 to change to a low state and causing power control signal 806 to return to a logic high level indicating a return to the low power state. The power control signal 806 transition may cause regulators 509 and 510 to reduce driving strength to transistors 412, 416, 522, and 526 or to turn off some circuits. In an example, in response to the power control signal 806, controller 712 may deactivate some or all of the switches 710, 714, 718, and 722 to reduce the bias currents.

In a particular example, the PWM pulse 810 is short (or the time between pulses is short) such that a next transition is detected by transition detector circuit 406 while the timer signal 812 for the previous transition is still increasing. In this instance, the opposite transition causes the timer 420 to be reset, restarting the timer signal 812. In this instance, the pre-driver circuit 508 does not return to the low power mode, but rather maintains power to transistors 412, 416, 522, and 526 at least until the timer exceeds a threshold.

In diagram 800, timer signal 812 is depicted as a sawtooth-type of waveform, which is intended to indicate that the timer signal 812 should at least partially track the edge slew rate of the PWM pulse 302. In some instances, the slope of timer signal 812 may match the slew rate of PWM pulse 302.

In a particular implementation, the transition edge 304 slew rate (SR) control can be provided by integrating a current (I) over a capacitor (Cc) as shown in Equation 1 below.

$$SR = \frac{1}{Cc}\int I(t) \cdot dt \Leftrightarrow SR = \frac{I}{Cc} \therefore I(t) = cte. \quad (1)$$

The timer can also be based on integrating a current proportional to I, on a capacitor proportional to Cc, allowing the timer signal 812 to assume the same slope/shape as the transition edge of PWM pulse 302. In this example, the timer 420 is "blind" to the PWM pulse 302. Thus, the time counted by the timer (as represented by the ramp up of timer signal 812) takes into account the longest propagation delay versus load current, which loses some efficiency gain in cases where the propagation delay is shorter.

In an alternative embodiment, a more complex scheme can be used to improve this aspect. In one possible example, a circuit can be used to detect when the gates of the output power switches (such as transistors 410, 418, 520 and 528) cross a certain voltage to obtain an estimation of PWM pulse 302. In some instances, some sort of time count may be needed to provide some margin to allow transistors 412, 416, 522, and 526 to complete their transition before returning to the low power mode. However, it may not be advisable, in some instances, to measure the PWM pulse 302 because, in case of an output short, the output PWM may never be detected.

While the above-description of FIGS. 4-8 included examples of circuits and signals that operate to reduce overall power consumption of circuit by dynamically biasing portions of a pre-driver circuit and transistors of an output stage, the particular circuit structure can be implemented in a variety of ways. In a particular example, a processor, such as a digital signal processor or micro processing unit, can execute instructions to control the voltage regulators or to produce a bias signal. Further, in an embodiment where the DSP 506 controls the pulse width modulator 402, DSP 506 may also control the bias voltages without needing another edge detector, such as edge detector 512 or transition detector circuit 406. Further, in a particular embodiment, feedback may be used to modify the pre-defined period of time so that the efficiency gain due to the off-time can be optimized.

Figure 9:
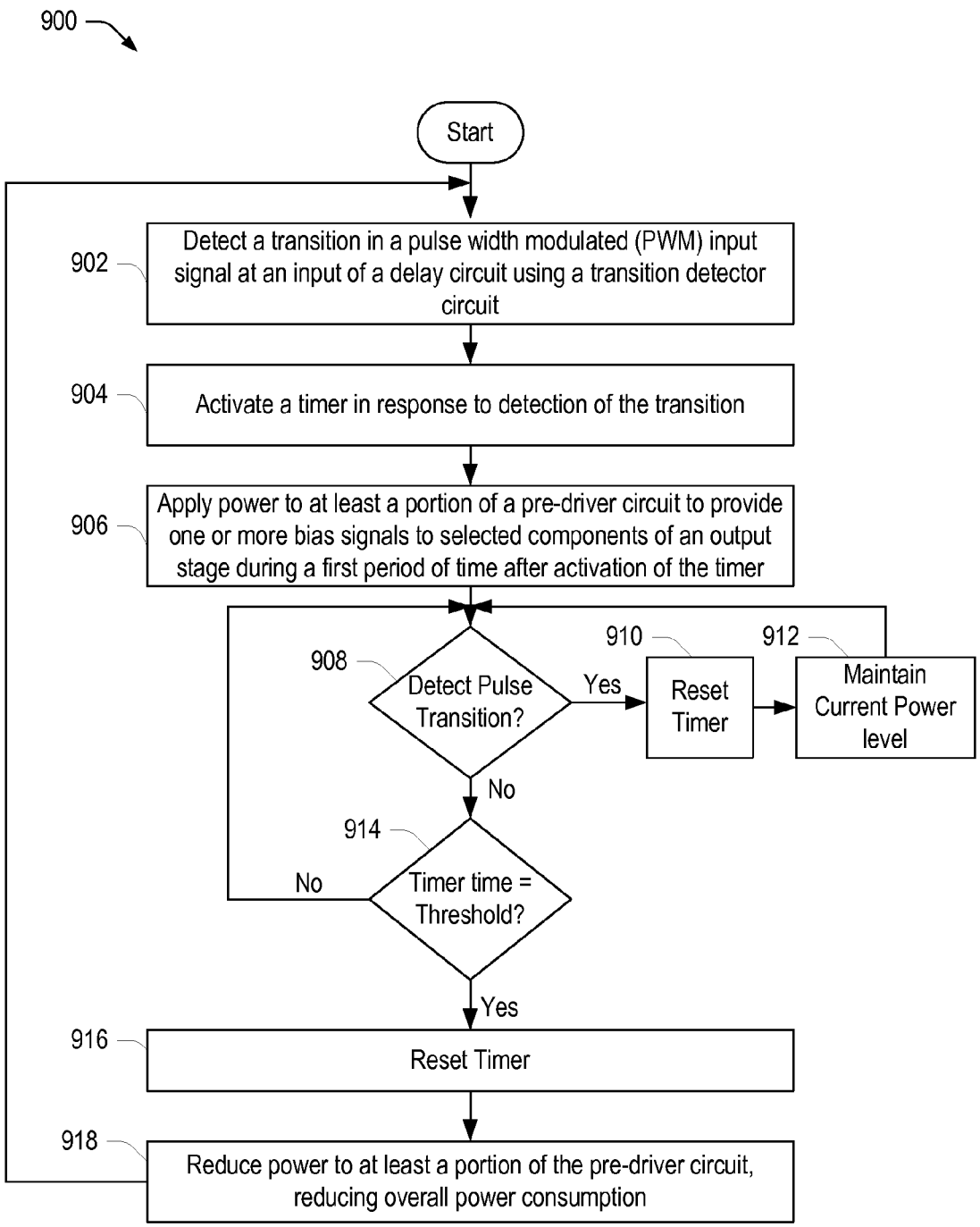
FIG. 9 is a flow diagram of an embodiment of a method of reducing power consumption by dynamically biasing at least a portion of an output stage.

FIG. 9 is a flow diagram of an embodiment of a method 900 of reducing power consumption by dynamically biasing a driver circuit for an output stage of a device. At 902, a transition (rise or fall) in a pulse width modulated (PWM) input signal is detected at an input of a delay circuit using a transition detector circuit. In an alternative example, the signal may be any type of signal that includes transitions that represent information. The circuit includes an edge detector or a look ahead circuit to detect the transition and a delay circuit to delay propagation of the signal to the output stage. The delay circuit 407 delays the signal before providing it to the input of adjustable buffer circuit 426. Advancing to 904, a timer is activated (while the delay circuit 407 delays the signal) in response to detecting the transition. In one instance, the timer may be a standalone circuit. In another instance, the timer may be implemented in firmware executable by a processor, such as a DSP (such as DSP 506 in FIG. 5) or a microcontroller unit, or may be implemented as a controller, such as controller 712 in FIG. 7. Continuing to 906, power is applied to at least a portion of a pre-driver circuit (while the delay circuit 407 continues to delay the signal) to provide one or more bias signals to selected components of an output stage during a first period of time after activation of the timer. In an example, the controller controls the pre-driver circuit to allow current flow through selected components of the pre-driver circuit to selectively provide the bias signals. Once the one or more bias signals are generated, the delay circuit 407 provides the signal to the input of the adjustable buffer circuit 426, which utilizes at least one of the bias signals for providing a drive signal to the output stage 504.

Proceeding to 908, if another pulse transition is detected, the method 900 moves to 910 and the timer is reset. Continuing to 912, the current power level is maintained and the method 900 returns to 908.

Returning to 908, if no pulse transition is detected, the method 900 continues to 914 and if the timer time is not equal to a threshold, the method 900 returns to 908. Otherwise, if the timer time equals (or exceeds) the threshold, the method 900 proceeds to 916 and the timer is reset. Continuing to 918, power is reduced to at least a portion of the pre-driver circuit, reducing overall power consumption. The method 900 then returns to 902 to detect a next transition.

In the illustrated example of FIG. 9, in the event of a pulse of short duration or two pulses separated by a short gap, where the duration or gap between transitions is less than the pre-determined threshold time, the current power level is maintained (block 912) by continuing to apply the one or more bias currents to the selected components of the output stage. While the embodiment of FIG. 9 represents one possible method of selectively activating a portion of an output stage, other methods are also possible. One example of an alternative embodiment of a method is described below with respect to FIG. 10.

Figure 10:
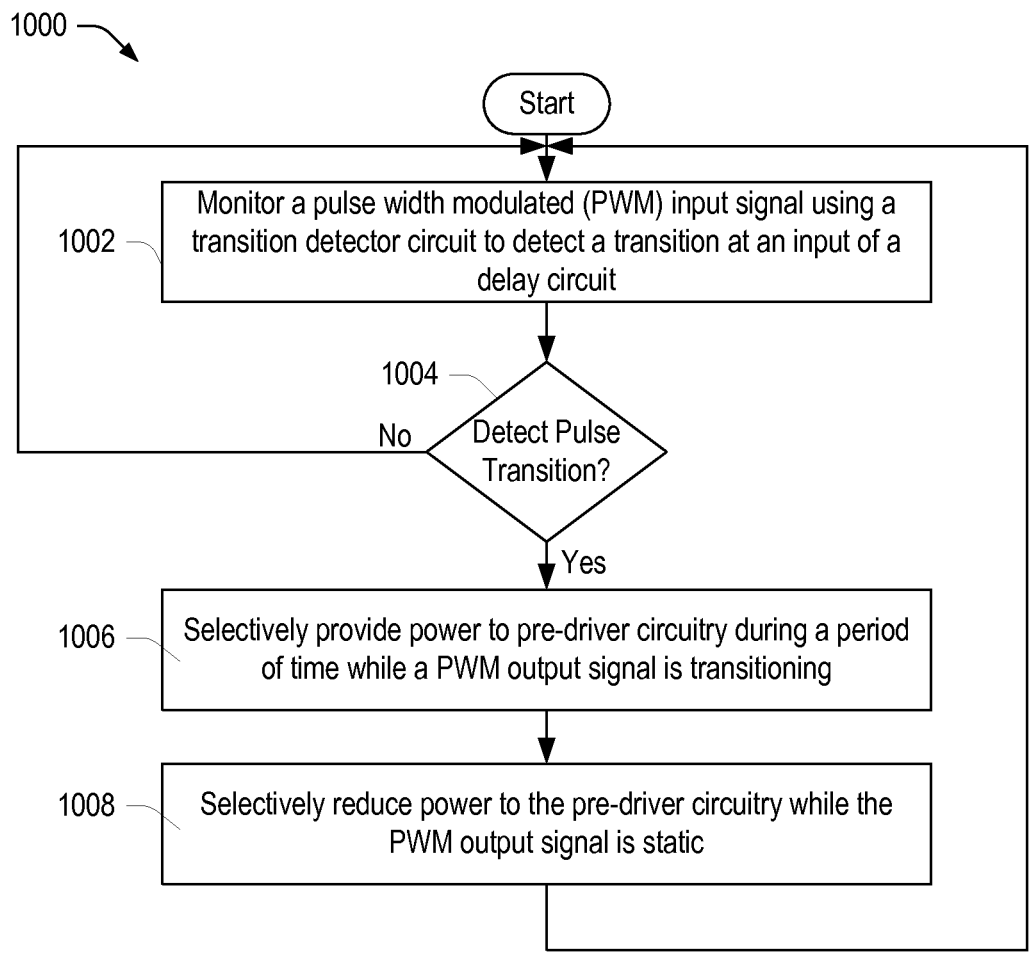
FIG. 10 is a flow diagram of a second embodiment of a method of reducing power by dynamically biasing at least a portion of an output stage.

FIG. 10 is a flow diagram of a second embodiment of a method 1000 of reducing power by dynamically biasing a driver circuit for an output stage of a device. At 1002, a PWM signal is monitored using a transition detector circuit to detect a transition at an input of a delay circuit. In alternative embodiments, the DSP may already possess the transition timing information. In other embodiments, an edge detector circuit may be used. Advancing to 1004, if no pulse transition is detected, the method 1000 returns to 1002 to continue to monitor for the transition. At 1004, if a transition is detected, the method 1000 proceeds to 1006 and power is selectively provided to pre-driver circuitry during a period of time while a PWM output signal is transitioning. In an example, the input signal is delayed using a delay circuit while the power is selectively provided to the pre-driver circuitry. In this instance, the delay circuit delays the arrival of the transition at the output stage until after the pre-driver circuitry is fully charged so that the pre-driver circuit is ready to drive the output stage. The period of time may be determined from a timer or based on measurements of signals applied to gates of transistors of the output stage 504. Moving to 1008, power is selectively reduced to the pre-driver circuitry while the PWM output signal is static. The method then returns to 1002 to check for a pulse transition.

In a particular embodiment, as discussed above, the removal of the bias signals, deactivation of portions of the output stage, or selective power reduction to the pre-driver circuitry may be based on a timer. In a particular example, when a value of the timer exceeds a pre-determined threshold, the controller may reduce power to at least a portion of the output stage.

In conjunction with systems, methods, and circuits described above with respect to FIGS. 1-10, a circuit includes a pre-driver circuit having a control input and a driver output that is coupled to an output stage. The circuit further includes a delay circuit including an input for receiving a signal and an output for providing a delayed version of the signal to an input of a pre-driver circuit that is coupled to a signal input of the output stage. The circuit further includes a transition detector coupled to the input of the delay circuit. The transition detector includes a detector output and is configured to detect a transition within the signal and to provide a look ahead signal to the detector output in response to detecting the transition. The circuit also includes a controller coupled to the detector output and to the control input of the pre-driver circuit. The controller controls the pre-driver circuit to adjust one or more bias currents provided to one or more voltage regulators for providing bias signals to a portion of the output stage and to an adjustable buffer circuit for providing a delayed version of the signal to the output stage. The circuit may include a timer, and the controller can be configured to reduce power to the pre-driver circuit after a period of time has elapsed. In an example, the period of time corresponds to a pre-determined period sufficient to allow the pre-driver to turn on fully and to power the output stage.

In an example, the controller may be implemented as a finite state machine. In another example, the controller can be implemented in software or firmware executing on a processor, such as a digital signal processor, a general purpose processor, and microcontroller unit, or other processing device. Further, the timer may be implemented as a circuit component or as a software-based timer.

Although the present invention has been described with reference to preferred embodiments, workers skilled in the art will recognize that changes may be made in form and detail without departing from the scope of the invention.

What is claimed is:

1. A circuit comprising:
    a delay circuit including an input for receiving a signal and an output for providing a delayed version of the signal;
    a transition detector coupled to the input of the delay circuit and including a detector output, the transition detector to detect a transition within the signal and to provide a look ahead signal to the detector output in response to detecting the transition;
    a pre-driver circuit including an input coupled to the output of the delay circuit to receive the delayed version of the signal, a control input, at least one signal output, and a plurality of bias outputs;
    a controller coupled to the detector output to receive the look ahead signal and to the control input of the pre-driver circuit to provide a control signal, the controller to control bias signals on the plurality of bias outputs to selectively increase a driving strength of signals and biases applied to an output stage in response to the look ahead signal; and
    the output stage including a first transistor having a control terminal coupled to the at least one signal output of the pre-driver circuit to receive the delayed version of the signal and including a second transistor coupled between the first transistor and an output node and having a control terminal coupled to one of the plurality of bias outputs of the pre-driver circuit; and
    a timer configured to start in response to a delayed transition within the delayed version of the signal.

2. The circuit of claim 1, wherein the pre-driver circuit includes a current mirror comprising:
a first current flow path for providing a first current;
a plurality of second current flow paths, each of the plurality of second current flow paths for providing a second current proportional to the first current, the plurality of second current flow paths for producing a bias current; and
wherein the controller controls the pre-driver circuit by selectively enabling one or more the plurality of second current flow paths to adjust the bias current.

3. The circuit of claim 2, wherein the pre-driver circuit further comprises at least one voltage regulator including a bias input for receiving the bias current, a voltage reference input, a feedback input, and an output coupled to the output stage.

4. The circuit of claim 1,
wherein the controller controls the pre-driver circuit to decrease a bias current applied to at least one of the plurality of bias outputs when an elapsed time value of the timer exceeds a threshold.

5. The circuit of claim 1, wherein the controller controls the pre-driver circuit to increase the driving strength of the signals and the biases applied to the output stage in response to the look ahead signal and to decrease the driving strength after a period of time has elapsed.

6. The circuit of claim 1, wherein the at least one signal output comprises:
a first output for providing a first delayed version of the signal;
a second output for providing a first bias signal of the bias signals on the plurality of bias outputs;
a third output for providing a second bias signal of the bias signals on the plurality of bias outputs; and
a fourth output for providing a second delayed version of the signal.

7. The circuit of claim 6, further comprising the output stage, wherein the output stage comprises:
the first transistor including a first current electrode coupled to a power supply terminal, the control terminal coupled to the first output of the pre-driver circuit, and a second current electrode;
the second transistor including a first current electrode coupled to the second current electrode of the first transistor, the control terminal coupled to a first bias output of the plurality of bias outputs, and a second current electrode coupled to the output node;
a third transistor including a first current electrode coupled to the output node, a control terminal coupled to a second bias output of the plurality of bias outputs, and a second current electrode; and
a fourth transistor including a first current electrode coupled to the second current electrode of the third transistor, a control terminal coupled to the second output of the pre-driver circuit, and a second current electrode coupled to a second power supply terminal.

8. The circuit of claim 7, wherein:
the controller controls the pre-driver circuit to produce a first bias current and a second bias current; and
the controller controls the second transistor using the first bias current and controls the third transistor using the second bias current.

9. A circuit comprising:
an output stage including a plurality of transistors;
a delay circuit including an input for receiving a signal and an output for providing a delayed version of the signal;
a transition detector including a detector input coupled to the input of the delay circuit and including a detector output, the transition detector to provide a look ahead signal to the detector output in response to each transition within the signal at the input of the delay circuit;
a pre-driver circuit including a signal input coupled to the output of the delay circuit, and including a control input, a plurality of signal outputs including at least one signal output configured to provide the delayed version of the signal to a first transistor of the plurality of transistors, and a plurality of bias outputs including at least one bias output coupled to a control terminal of a second transistor of the plurality of transistors, the second transistor coupled to an output node; and
a controller including an input coupled to the detector output to receive the look ahead signal and including an output to provide a control signal to the control input of the pre-driver circuit to selectively increase a driving strength of signals and biases provided to the output stage in response to the look ahead signal, wherein the pre-driver circuit comprises:
an adjustable buffer circuit including an input coupled to the output of the delay circuit, a control input, and a plurality of outputs configurable to couple to the output stage;
a voltage regulator including a control input and a plurality of bias outputs configurable to couple to the output stage; and
a current mirror including a plurality of switches, a first current path coupled to the control input of the voltage regulator, and a second current path coupled to the control input of the adjustable buffer circuit, the plurality of switches responsive to control signals from the controller to control a first bias current associated with the first current path and a second bias current associated with the second current path.

10. The circuit of claim 9, wherein the controller controls the current mirror to alter amplitudes of the first and second bias currents to selectively alter the driving strength of the signals and the biases provided to the output stage.

11. The circuit of claim 10, further comprising:
a timer configured to start in response to a transition in the delayed version of the signal and to reset when an elapsed time value of the timer reaches a pre-determined threshold; and
wherein the controller turns off the switches to decrease the bias currents of the first and second current paths when the elapsed time of the timer exceeds the pre-determined threshold.

12. The circuit of claim 11, wherein the controller resets the timer when a second transition in the delayed version of the signal reaches the output of the delay circuit before the elapsed time of the timer reaches the pre-determined threshold, and maintains the first and second bias currents of the current mirror until the elapsed time of the timer exceeds the pre-determined threshold.

13. The circuit of claim 9, further comprising the output stage, wherein the plurality of transistors comprises:
the first transistor including a first current electrode coupled to a power supply terminal, a control terminal coupled to one of the plurality of signal outputs, and a second current electrode;
the second transistor including a first current electrode coupled to the second current electrode of the first transistor, the control terminal coupled to one of the plurality of bias outputs, and a second current electrode coupled to the output node;

a third transistor including a first current electrode coupled to the output node, a control terminal coupled to a second one of the plurality of bias outputs, and a second current electrode; and a fourth transistor including a first current electrode coupled to the second current electrode of the third transistor, a control terminal coupled to a second one of the plurality of signal outputs, and a second current electrode coupled to a second power supply terminal.

* * * * *